United States Patent
Ng et al.

(10) Patent No.: US 7,705,685 B2
(45) Date of Patent: Apr. 27, 2010

(54) LOW-VOLTAGE OSCILLATOR WITH CAPACITOR-RATIO SELECTABLE DUTY CYCLE

(75) Inventors: Chik Wai David Ng, Kowloon (HK); Yat To William Wong, Hong Kong (HK); Ho Ming Karen Wan, Hong Kong (HK); Kwok Kuen David Kwong, Davis, CA (US)

(73) Assignee: Hong Kong Applied Science and Technology Research Institute Co., Ltd., Hong Kong (HK)

( * ) Notice: Subject to any disclaimer, the term of this patent is extended or adjusted under 35 U.S.C. 154(b) by 332 days.

(21) Appl. No.: 11/952,127

(22) Filed: Dec. 6, 2007

(65) Prior Publication Data

US 2009/0146749 A1   Jun. 11, 2009

(51) Int. Cl.
*H03B 27/00* (2006.01)
(52) U.S. Cl. .................. 331/57; 331/111; 331/143; 331/135; 331/1 A
(58) Field of Classification Search .............. 331/57, 331/111, 135, 143, 1 A
See application file for complete search history.

(56) References Cited

U.S. PATENT DOCUMENTS

| | | | |
|---|---|---|---|
| 4,736,118 A | 4/1988 | Fischer | |
| 5,097,303 A * | 3/1992 | Taguchi | 365/149 |
| 5,250,914 A | 10/1993 | Kondo | |
| 6,335,893 B1 * | 1/2002 | Tanaka et al. | 365/226 |
| 6,384,652 B1 | 5/2002 | Shu | |
| 6,535,435 B2 * | 3/2003 | Tanaka et al. | 365/189.09 |

FOREIGN PATENT DOCUMENTS

CN   1767371 A   3/2006

OTHER PUBLICATIONS

Kimball, J.W.; Flowers, T.L. ; Chapman, P.L.;"Low-input-voltage, low-power boost converter design issues", Power Electronics Letters, IEEE vol. 2, Issue 3, Sep. 2004 pp. 96-99.

(Continued)

*Primary Examiner*—Arnold Kinkead
(74) *Attorney, Agent, or Firm*—Stuart T. Auvinen; gPatent LLC

(57) ABSTRACT

An oscillator operates at a very low voltage yet has a duty cycle that is set by a ratio of capacitors that are charged and discharged. Sub-threshold p-channel transistors conduct sub-threshold currents below the normal threshold voltage, and drive set and reset inputs of a set-reset S-R latch. The S-R latch drives the oscillator outputs. The oscillator outputs feed back to charging p-channel transistors that charge one plate of the capacitors. During half of the cycle, the charging p-channel transistor is off, allowing one plate of the capacitors to discharge through an n-channel discharge transistor. After a period of discharge determined by the capacitance of the capacitor, the gate of a sub-threshold p-channel transistor falls enough for sub-threshold current to flow, triggering the set or reset input of the S-R latch. Since sub-threshold currents are needed to toggle the S-R latch, the oscillator begins to oscillate below the threshold voltage.

20 Claims, 8 Drawing Sheets

OTHER PUBLICATIONS

Leung, C. Y., Mok P. K. T. and Leung K. N., "A 1-V Integrated Current-Mode Boost Converter in Standard 3.3/5-V CMOS Technologies," IEEE Journal of Solid-State Circuits, vol. 40, No. 11, pp. 2265-2274, Nov. 2005.

Toki, M: "Low DC-driving-voltage crystal oscillator", the IEEE International Frequency Control Symposium, 1999., Proceedings of the 1999 Joint Meeting of the European, vol. 1, Apr. 13-16, 1999, pp. 412-415.

PCT Search Report for PCT/CN/2007/071185, Sep. 18, 2008.

* cited by examiner

LOW-VOLTAGE OSCILLATOR WITH CAPACITOR-RATIO SELECTABLE DUTY CYCLE

FIELD OF THE INVENTION

This invention relates to oscillator circuits, and more particularly to low-voltage selectable-duty-cycle oscillators.

BACKGROUND OF THE INVENTION

Advances in semiconductor processing have resulted in the drastic reduction in device sizes. The gate length of a transistor, meal line widths and spacings, and oxide thicknesses have all undergone a dramatic reduction. However, the voltages applies to these reduced-size transistors must also be reduced to prevent damage to these increasingly tiny devices. Thus the power-supply voltage, such as Vcc or Vdd, has also been reduced from 5 volts to 3.3 volts to 1.8 volts, and now to 1.5 or even 1.2 volts.

While the device sizes have scaled downward, the transistor threshold voltage, Vtn or Vtp, has not scaled down as dramatically. This threshold voltage is now closer to the power-supply voltage than ever before. Designing circuits for low power-supply voltages while the threshold voltages remain around 0.7 volts is quite challenging.

A widely used circuit is the oscillator. An oscillator produces an output that oscillates, usually between the power supply voltage and ground when the loading on the output is not too severe. Oscillators are widely used as part of phase-locked loops (PLL's), clock generators, voltage pumps, and back-bias generator circuits.

A basic oscillator can be constructed from a loop or ring of an odd number of inverters. Such ring oscillators have a period or cycle time determined by the delay around the loop. Other oscillators use R-C delays to set cycle times.

The duty cycle or percent of the period that the output is high rather than low is another parameter of an oscillator circuit. 50%-50% duty cycles may be required in some applications, while other applications may need a skewed clock such as 60%-40%.

The amount of time that an oscillator needs to begin oscillating is also determined by the circuit used, as well as the ramp time of the power supply. Oscillators that can begin oscillating at low power supply voltages are desirable since the clocks may begin clocking during reset before the power supply has reached its full steady-state operating value. These extra clock pulses during reset are especially valuable for large systems with many clocked nodes, since the added clocking can help reset the circuit into a know stable state that consumes less power than if nodes remain floating after reset.

What is desired is an oscillator circuit that operates at very low power-supply voltages. An oscillator that quickly begins oscillating during reset is also desirable. An oscillator that has a duty cycle that can be set by circuit parameters is also desirable.

DETAILED DESCRIPTION

The present invention relates to an improvement in low-voltage oscillators. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

Figure 1:
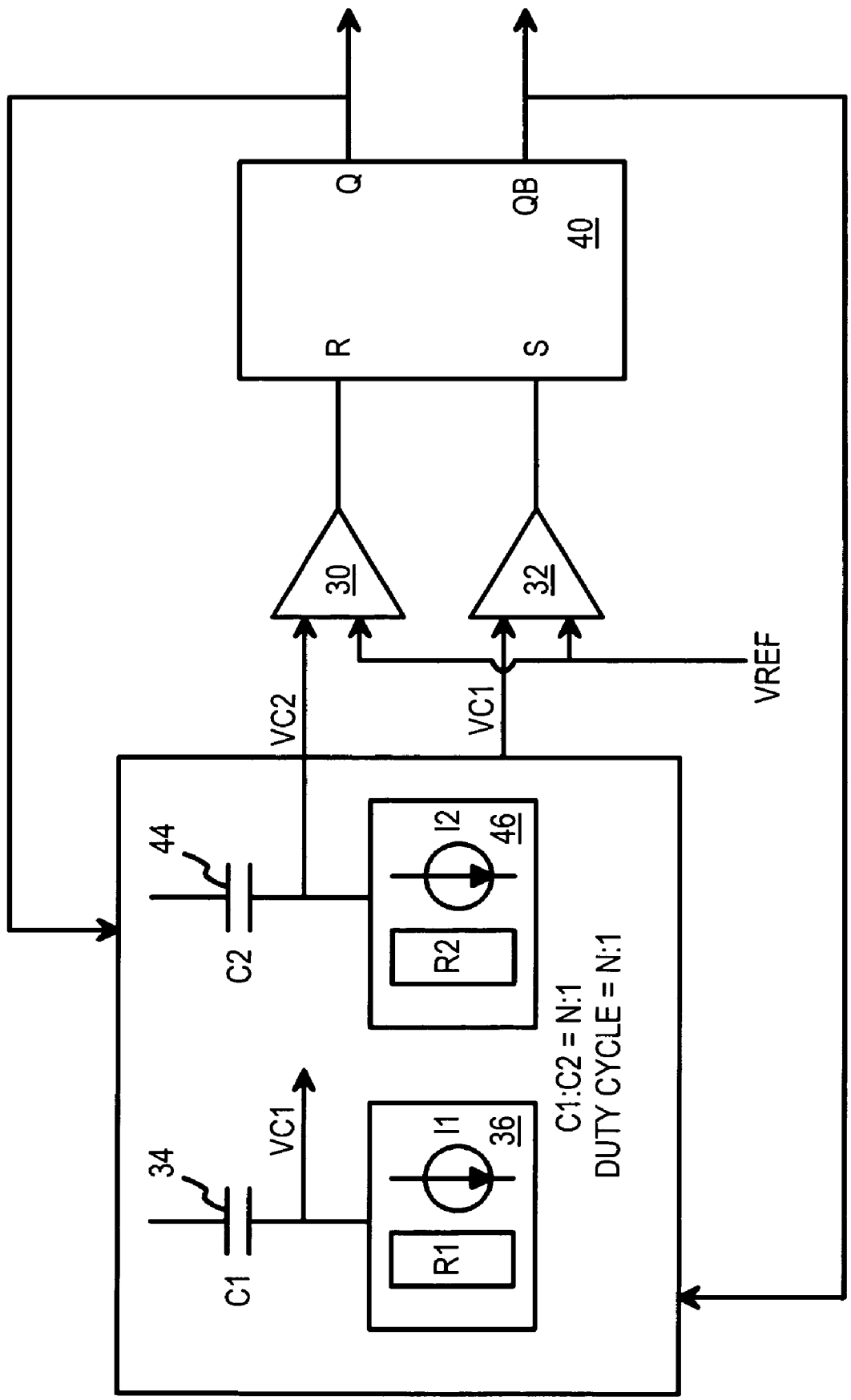
FIG. 1 is a block diagram of a simplified oscillator with a selectable duty cycle.

FIG. 1 is a block diagram of a simplified oscillator with a selectable duty cycle. The output Q and inverse output QB of set-reset S-R latch 40 oscillate when the oscillator is in operation.

S-R latch 40 toggles output Q high and QB low when its set S input pulses high, which occurs when comparator 32 determines that voltage VC1 is above reference voltage VREF. S-R latch 40 toggles output QB high and Q low when its reset R input pulses high, which occurs when comparator 30 determines that voltage VC2 is above reference voltage VREF.

Voltage VC1 is the voltage of the bottom plate of C1 capacitor 34. A charge stored across C1 capacitor 34 is reduced when the QB output from S-R latch 40 pulses low. The charge stored across the two plates of C1 capacitor 34 is increased as charge is continuously removed from node VC1 by discharge circuit 36. Discharge circuit 36 may include a current sink and a resistor.

Voltage VC2 is the voltage of the bottom plate of C2 capacitor 44. A charge stored across C2 capacitor 44 is reduced when the Q output from S-R latch 40 pulses low. The charge stored across the two plates of C2 capacitor 44 is increased as charge is continuously removed from node VC2 by discharge circuit 46. Discharge circuit 46 also may include a current sink and a resistor.

The duty cycle of the oscillator is determined by the capacitor ratio when other circuit components are matched for set and reset paths. When C1 capacitor 34 and C2 capacitor 44 have the same capacitance values, then the duty cycle is 50%-50%, since both capacitors 34, 44 require the same amount of time to build up charge.

When capacitors 34, 44 have different values, the duty cycle can be adjusted to other values. The duty cycle is N:1, where N is the capacitance ratio C1/C2, where C1 is the capacitance in farads of C1 capacitor 34, and C2 is the capacitance in farads of C2 capacitor 44. The duty cycle could be set to 66%-33% by making C1 twice the size of C2.

Having the duty cycle be adjustable by the capacitor ratio is advantageous because the ratio of capacitance values is easy to determine or modify. The capacitance values are much less sensitive to process and supply-voltage variations than are transistors, so this oscillator is preferable to a ring oscillator that has its duty cycle determined by delays through an odd number of transistor-based inverters in the loop.

Figure 2:
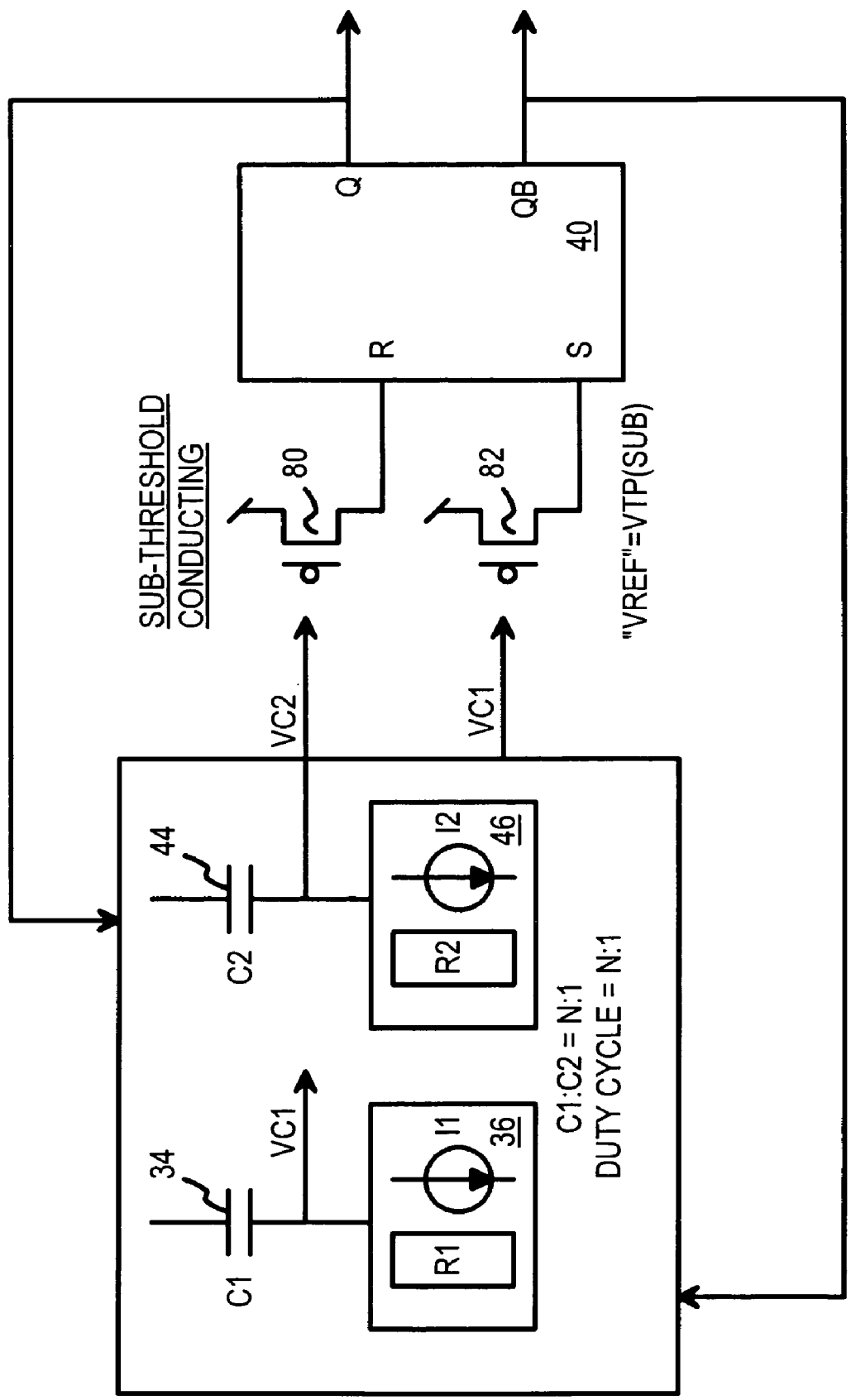
FIG. 2 shows an oscillator using sub-threshold-conducting transistors as comparators to achieve ultra-low-voltage operation.

FIG. 2 shows an oscillator using sub-threshold-conducting transistors as comparators to achieve ultra-low-voltage operation. Having the oscillator operate at extremely low voltages is desirable since the oscillator then begins oscillating early, providing a pulsing clock to other blocks that are being initialized during reset. This early pulsing clock can reduce the number of floating nodes or metastable nodes in the system sooner than a more traditional oscillator that requires a higher voltage to begin oscillating. Power consumption is reduced more quickly, resulting in less drain on a battery when a system is powered up. Since portable battery-based electronic devices may be powered on and off frequently, this reset power consumption can be a significant portion of the system's power use.

Comparators 30, 32 in FIG. 1 are implemented as sub-threshold p-channel transistors 80, 82. P-channel transistors typically conduct when their gate voltages are more than a threshold below the power-supply voltage applied to the drains and substrates of the p-channel transistors. However, some conduction does occur before the threshold voltage is reached. This early conduction is caused by sub-threshold currents. Sub-threshold currents are smaller than above-threshold currents, but may still be useful despite their smaller size.

Sub-threshold p-channel transistors 80, 82 are designed for sub-threshold conduction. The size of sub-threshold p-channel transistors 80, 82 may be chosen to be larger than would otherwise be chosen using ordinary design methods, since ordinary design is usually based on the full-size currents that occur above threshold. The size of sub-threshold p-channel transistors 80, 82 is chosen so that enough sub-threshold current flows through them to toggle S-R latch 40. Since S-R latch 40 may be designed to have a small input capacitance, the amount of sub-threshold current that must be produced by sub-threshold p-channel transistors 80, 82 does not have to be large.

The gate voltage on sub-threshold p-channel transistors 80, 82 that causes enough sub-threshold current to flow is known as the sub-threshold, or Vtp(sub). The regular threshold Vtp might be 0.7 volt, while Vtp(sub) is 0.5 volt or lower. Thus sub-threshold conduction begins several hundred millivolts earlier than regular conduction.

Once the gate voltage (VC1) of sub-threshold p-channel transistor 82 falls below Vcc−|Vtp(sub)|, the set input of S-R latch 40 activates and sets S-R latch 40. Setting of S-R latch 40 causes Q to go high, allowing removal of charge on node VC2 by discharge circuit 46 and the build up of charge across C2 capacitor 44. Eventually VC2, the gate of sub-threshold p-channel transistor 80, goes low. When VC2, the gate voltage of sub-threshold p-channel transistor 80 falls below Vcc−|Vtp(sub)|, the reset input of S-R latch 40 activates and resets S-R latch 40. Thus toggling of S-R latch 40 and oscillation begins once the gates of sub-threshold p-channel transistors 80, 82 can fall below Vcc−|Vtp(sub)|.

Figure 3A:
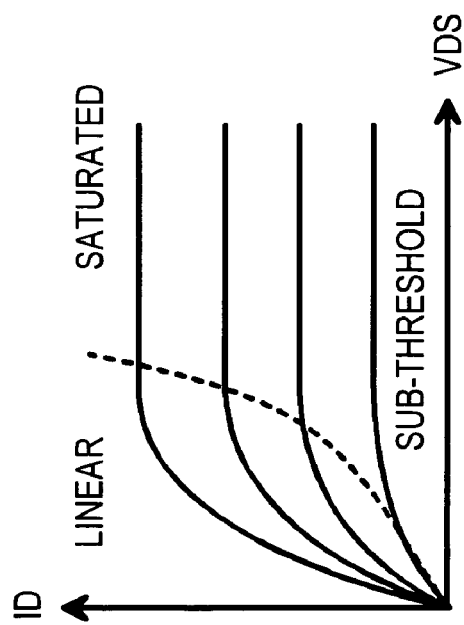
FIGS. 3A-B highlight sub-threshold conduction.
Figure 3B:
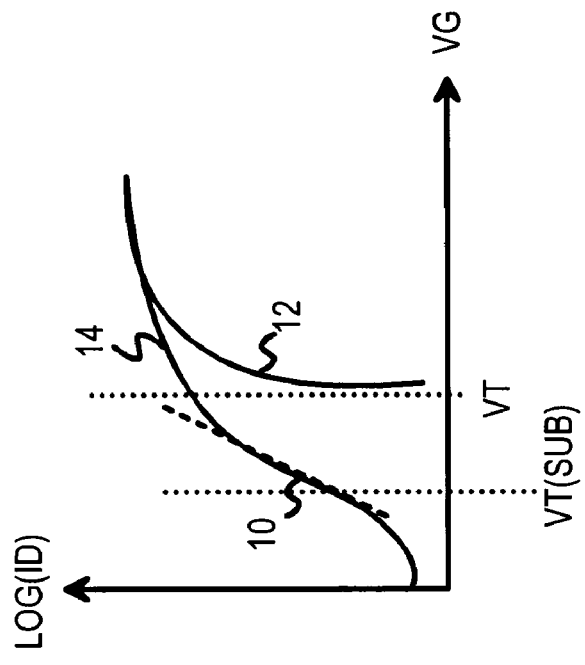

FIGS. 3A-B highlight sub-threshold conduction. FIG. 3A shows I-V curves of drain current (ID) through an n-channel transistor as a function of the drain-to-source voltage (VDS). Each curve is for a different gate-to-source voltage (VGS).

The I-V curves move up during the linear region of transistor operation, but flatten out in the saturated region of operation. Higher gate voltages produce higher currents in both the linear and saturated regions, but increased in drain voltage produces no further increase in current in the saturated region.

Sub-threshold currents flow for low gate voltages in the sub-threshold region below the bottom I-V curve. FIG. 3B highlights sub-threshold currents. In FIG. 3B, the logarithm of drain current log(ID) is plotted against gate voltage (VG). Threshold current 12 flows when the gate voltage VG is above the threshold voltage VT. Strong inversion occurs under the gate of the transistor, along a large current to flow. Total current 14 is the sum of threshold current 12 and sub-threshold current 10.

Sub-threshold current 10 flows when the gate voltage VG is below the threshold Vtn. A strong inversion channel has not yet formed under the gate. Sub-threshold current 10 can be approximated as linear near the sub-threshold voltage Vtn (sub), but this is a very rough approximation. The value of Vtn(sub) is also approximate, and it may be defined as when a defined amount of current flows.

Figure 4:
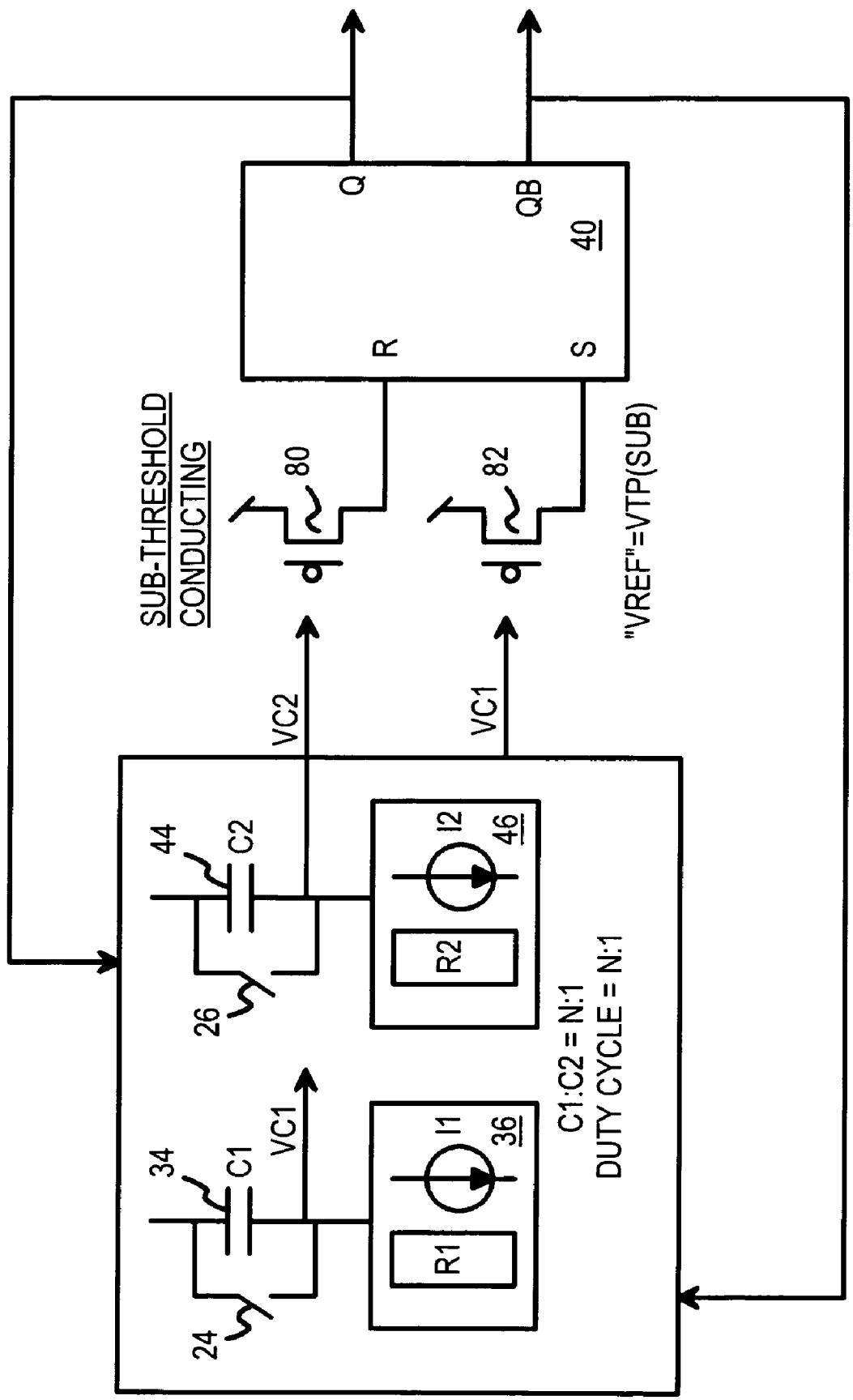
FIG. 4 shows charging capacitors in an ultra-low-voltage oscillator.

FIG. 4 shows charging capacitors in an ultra-low-voltage oscillator. Sub-threshold p-channel transistors 80, 82 operate as described earlier for FIG. 2. Voltages VC1 and VC2 are effectively compared against the sub-threshold voltage, Vcc−|Vtp(sub)| by sub-threshold p-channel transistors 80, 82, which function as comparators 30, 32 of FIG. 1.

Voltage VC1 is the lower-plate voltage of C1 capacitor 34. Discharge circuit 36 continuously removes charge from node VC1, increasing the charge stored across C1 capacitor 34. However, switch 24 is closed when output QB goes low from S-R latch 40, causing C1 capacitor 34 to discharge as both plates are driven to Vcc. Switch 24 has a much higher current drive than discharge circuit 36, allowing C1 capacitor 34 to be discharged to Vcc.

Voltage VC2 is the lower-plate voltage of C2 capacitor 44. Discharge circuit 46 continuously removes charge from node VC2, increasing the charge stored across C2 capacitor 44. However, switch 26 is closed when output Q goes low from S-R latch 40, causing C2 capacitor 44 to discharge as both plates are driven to Vcc. Switch 26 has a much higher current drive than discharge circuit 46, allowing C2 capacitor 44 to be discharged to Vcc.

Figure 5:
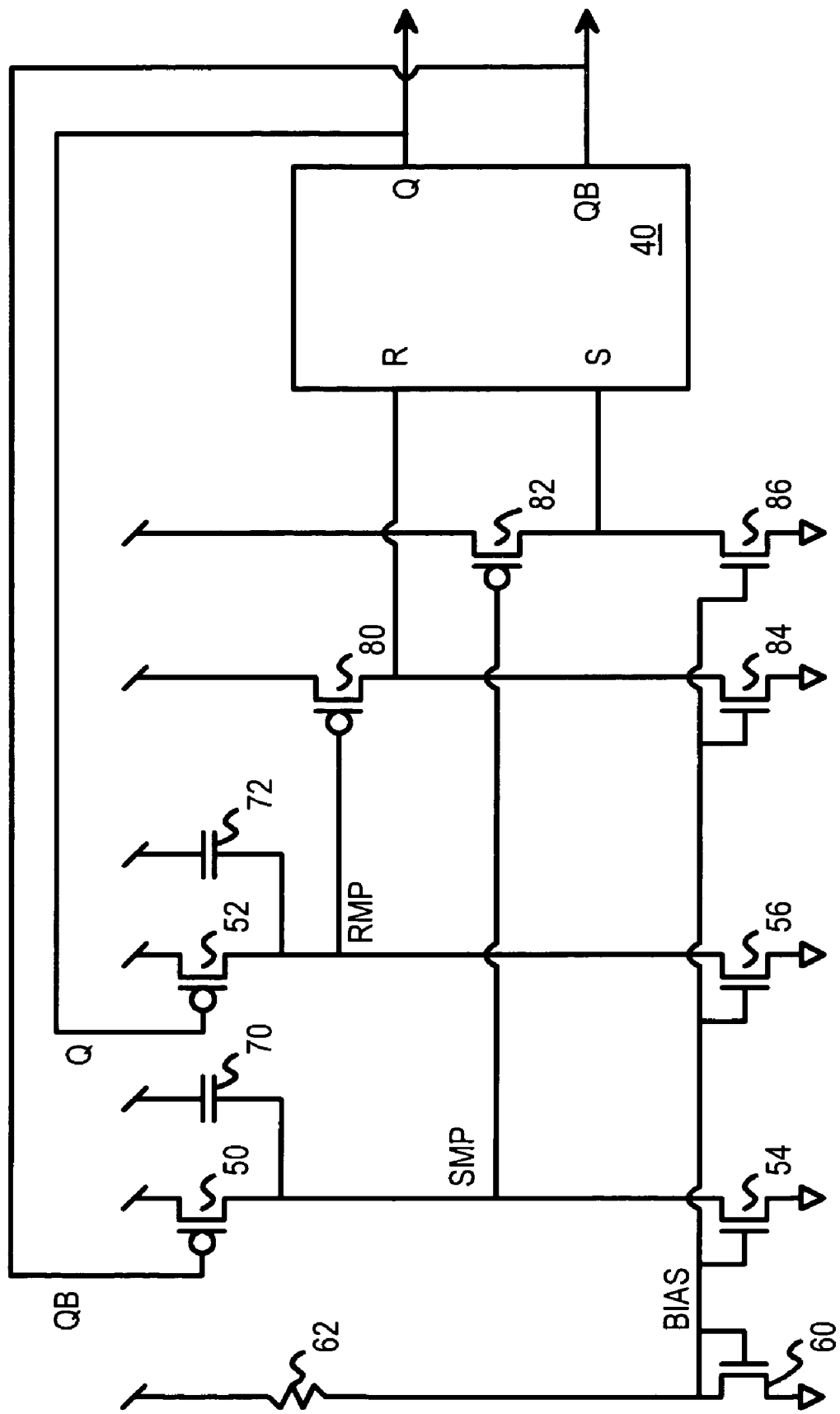
FIG. 5 is a simplified circuit schematic of an ultra-low-voltage oscillator with a duty cycle set by the capacitor ratio.

FIG. 5 is a simplified circuit schematic of an ultra-low-voltage oscillator with a duty cycle set by the capacitor ratio. The capacitance ratio of capacitors 70, 72 sets the duty cycle. As S-R latch 40 is set and reset, Q and QB toggle, causing charging p-channel transistors 50, 52 to conduct and drive all plates of capacitors 70, 72 to Vcc. Charging p-channel transistors 50, 52 have QB and Q, respectively, as their gates, and conduct when QB or Q are low.

A bias voltage BIAS is generated by current from bias resistor 62 flowing through the drain of n-channel bias transistor 60, which has its gate and drain connected together. The gate and drain of n-channel bias transistor 60 is voltage BIAS, which is also applied to the gates of n-channel discharge transistors 54, 56 and n-channel sink transistors 84, 86. Thus voltage BIAS acts to mirror the current through n-channel bias transistor 60 to other transistors 54, 56, 84, 86. The current through each leg can be set by the ratio of transistor sizes.

When S-R latch 40 is set, QB goes low and is applied to the gate of charging p-channel transistor 50, which turns on, driving both plates of capacitor 70 and set-ramp node SMP high. Set-ramp node SMP is applied to the gate of sub-threshold p-channel transistor 82, turning it off and sending the set pulse to the set input of S-R latch 40.

When S-R latch 40 is set, Q goes high, placing a high voltage near Vcc to the gate of charging p-channel transistor 52, turning transistor 52 off. Both plates of capacitor 72 were earlier driven high and the lower plate of capacitor 72 slowly begins to lose charge through n-channel discharge transistor 56. The discharge time is a function of the capacitance of capacitor 72. Once the lower plate of capacitor 72 is discharged sufficiently, the voltage on reset-ramp node RMP goes low enough to turn on sub-threshold p-channel transistor 80, which drives the reset input to S-R latch 40 high. S-R latch 40 is then reset.

Figure 6:
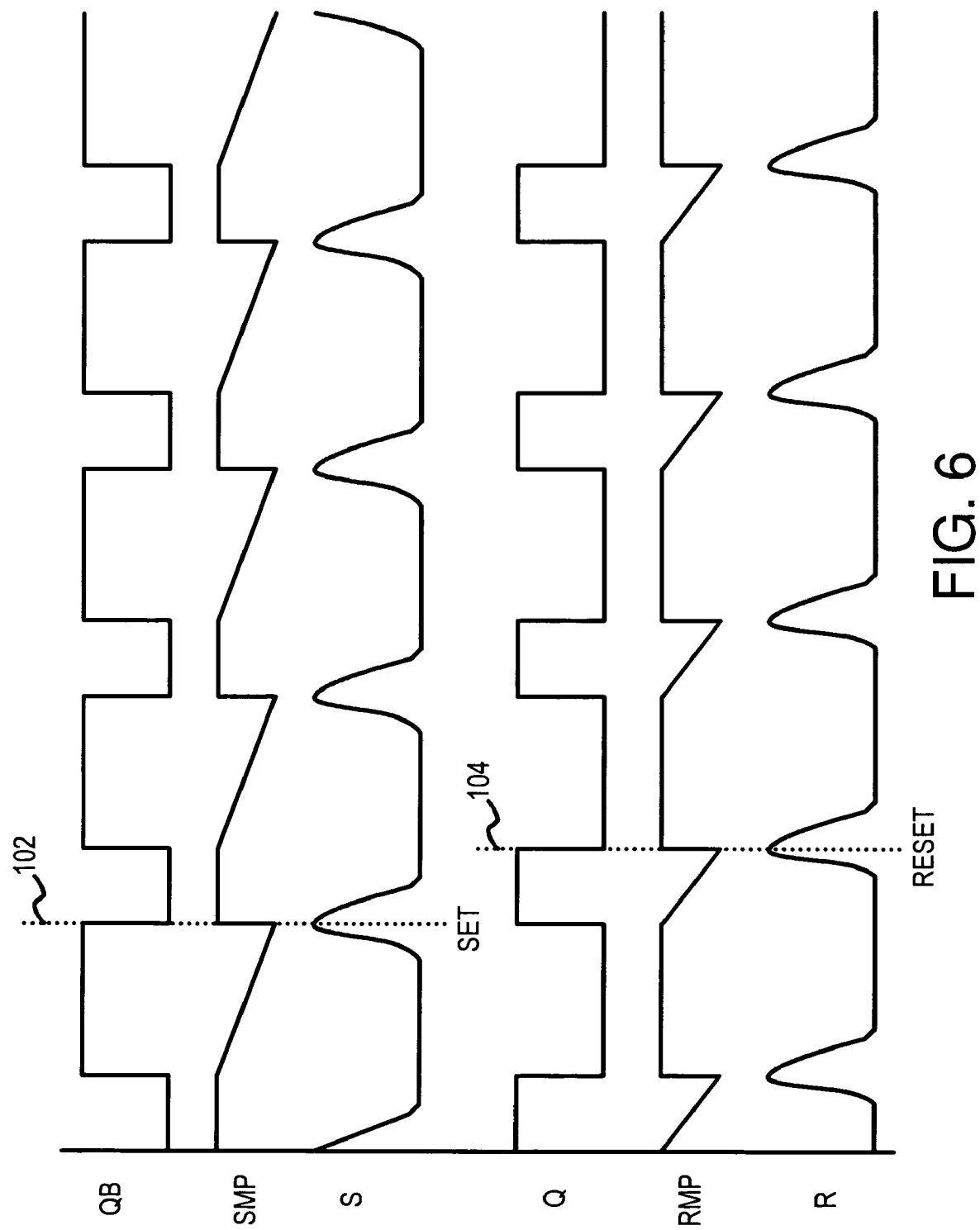
FIG. 6 is a waveform of operation of the ultra-low-voltage oscillator of FIG. 8.
Figure 8:
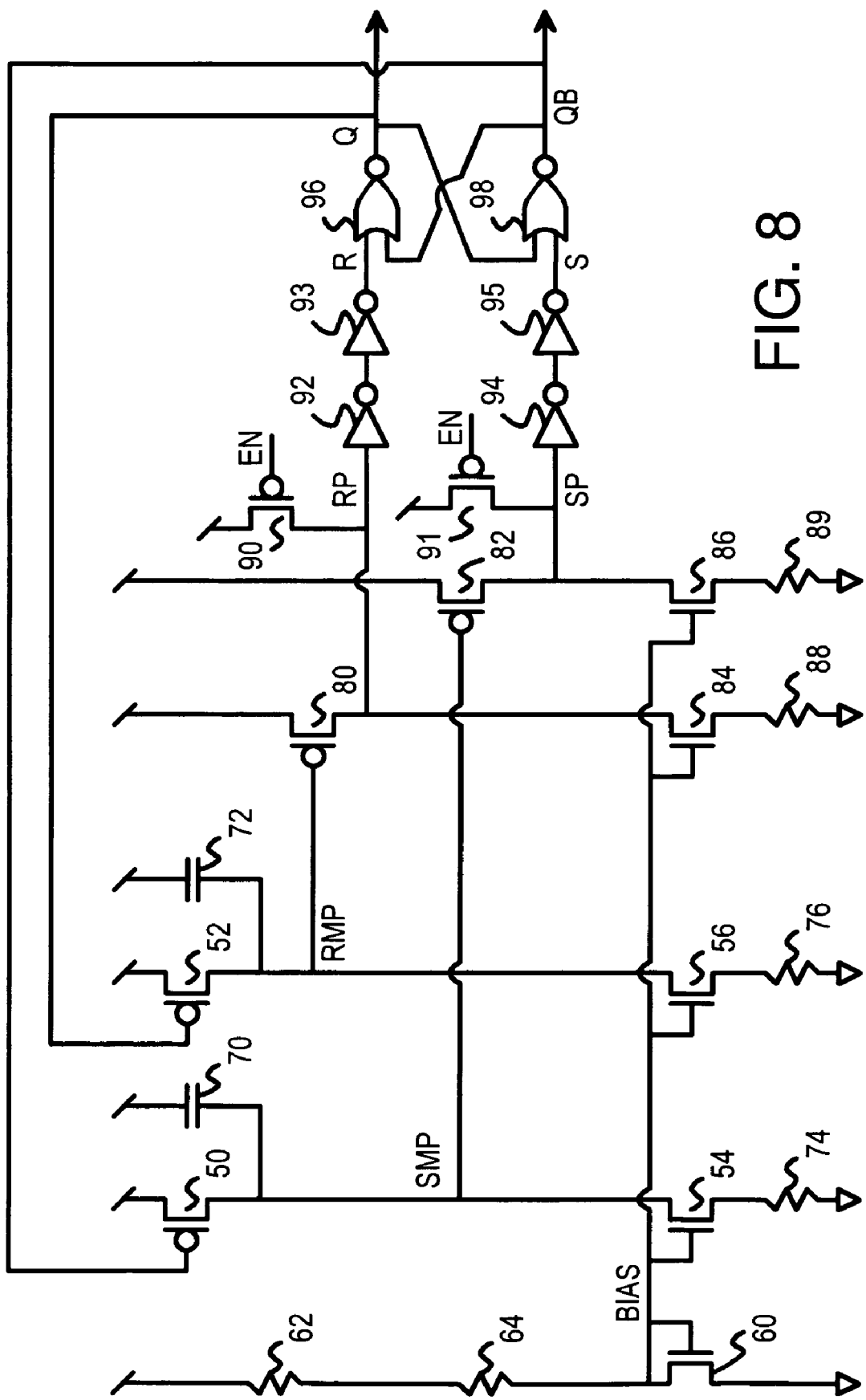
FIG. 8 is a more detailed circuit schematic of the oscillator.

FIG. 6 is a waveform of operation of the ultra-low-voltage oscillator of FIG. 8. In this simulation shown in FIG. 6, the power-supply voltage remains constant at about 0.7 volts. The simulated circuit has a capacitor ratio for a 33% duty cycle.

When output QB goes high, set capacitor 70 is allowed to discharge set-ramp node SMP over a period of time. Once SMP falls sufficiently below Vdd to turn on sub-threshold p-channel transistor 82, at time 102, the set input S to S-R latch 40 spikes high. S-R latch 40 is then set, with Q going high and QB going low. When QB goes low, charging p-channel transistor 50 turns on and quickly charges both plates of capacitor 70 high, quickly raising the voltage of set-ramp node SMP. The higher SMP quickly turns off sub-threshold p-channel transistor 82, causing the set signal to fall quickly. This causes the set pulse to have a sharp, quick spiked shape.

When output Q goes high at time 102, reset-ramp node RMP is allowed to lose charge over a period of time. Since reset capacitor 72 has about half the capacitance of set capacitor 70, RMP falls twice as quickly as SMP, and the high Q pulsewidth is half of the high QB pulsewidth.

Once RMP falls sufficiently below Vdd to turn on sub-threshold p-channel transistor 80, at time 104, the reset input R to S-R latch 40 spikes high. S-R latch 40 is then reset, with Q going low and QB going high at time 104. When Q goes low, charging p-channel transistor 52 turns on and quickly drives both plates of capacitor 72 high, quickly raising the voltage of reset-ramp node RMP. The higher RMP quickly turns off sub-threshold p-channel transistor 80, causing the reset signal to fall quickly. This causes the reset pulse to have a sharp, quick spiked shape as shown.

Figure 7:
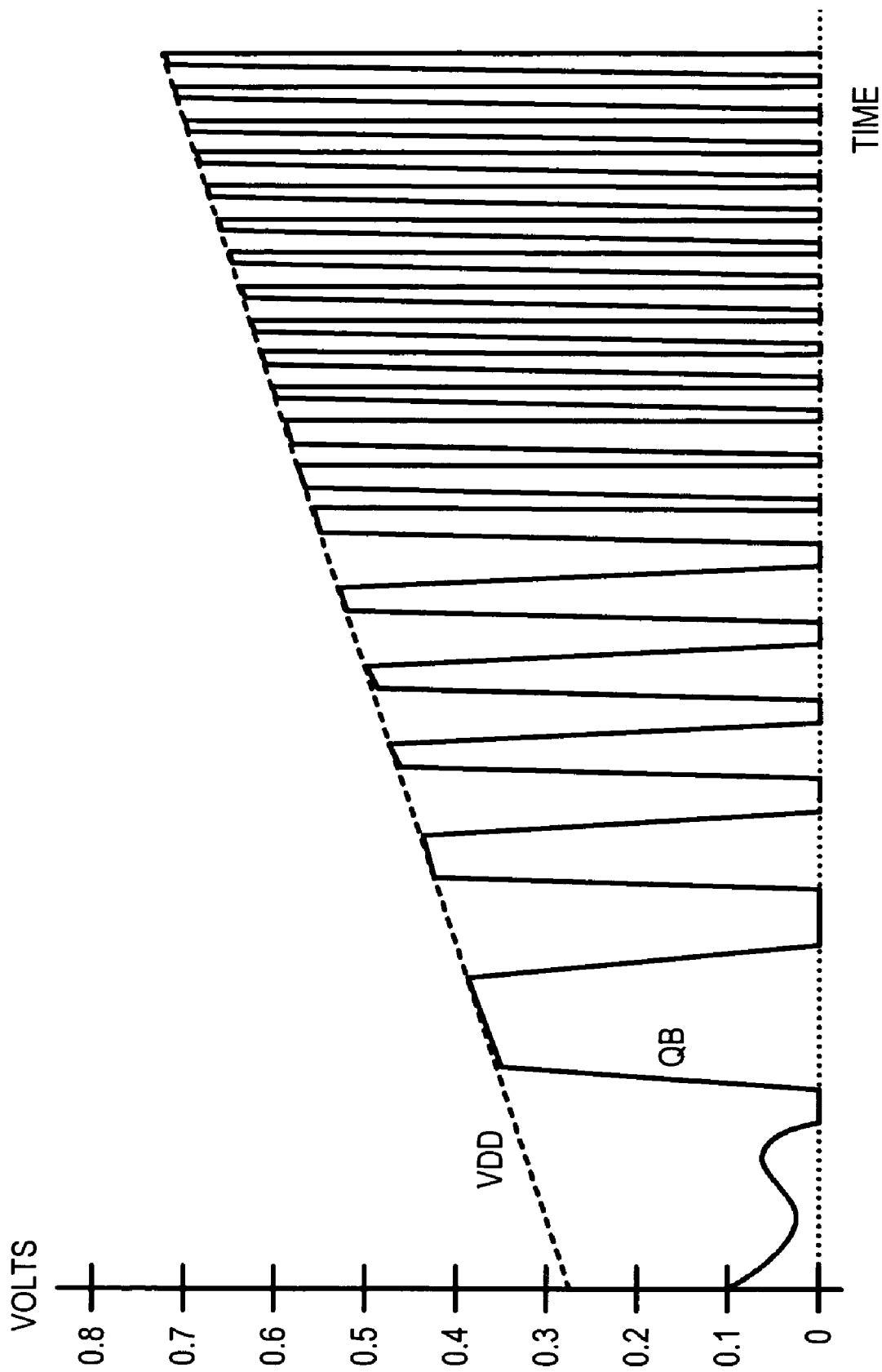
FIG. 7 is a waveform of start-up performance of the ultra-low-voltage oscillator of FIG. 8.

FIG. 7 is a waveform of start-up performance of the ultra-low-voltage oscillator of FIG. 8. FIG. 7 shows a much larger span of time than FIG. 6. As the power-supply voltage Vdd is ramped up from zero during reset, the oscillator at first does not toggle since Vdd is below the transistor threshold voltages of about 0.7 volt. However, once Vdd reaches 0.35 volt, the oscillator begins to oscillate, as shown by the QB output of S-R latch 40. The Q output also toggles but is not shown.

The cycle period is initially quite long, since the low power-supply voltage provides little current to charge and discharge the capacitors. As power-supply voltage Vdd increases, the cycle time decreases.

Since the oscillator uses sub-threshold p-channel transistors 80, 82 that are designed to conduct sufficient current to toggle S-R latch 40 in the sub-threshold region of transistor operation, S-R latch 40 begins toggling outputs Q, QB once Vdd rises above the sub-threshold voltage of about 0.35 volt. This is much lower than the full threshold of 0.5 to 0.9 volt. Thus early toggling occurs at an ultra-low Vdd.

The duty cycle remains relatively constant over a wide range of power-supply voltages. The duty cycle is 60% at Vdd=0.35 volt, 66% at Vdd=0.4 volt, 66% at Vdd=0.7 volt, and 66% at Vdd=1.5 volt, for a simulated oscillator designed for a 66% duty cycle. From the simulation, the lowest Vcc (or Vdd) that oscillation occurs is 0.35 volt. A constant duty cycle occurs when Vcc is 0.6 volt for simulated transistor thresholds of Vtn=0.7 volt and Vtp=0.8 volt.

FIG. 8 is a more detailed circuit schematic of the oscillator. Bias resistors 62, 64 both set the current flow through n-channel bias transistor 60. Tail resistors 74, 76, 88, 89 are added to the sources of n-channel transistors 54, 56, 84, 86, respectively. Tail resistors 74, 76, 88, 89 are added for the purpose of better matching between the current sources formed by n-channel transistors 54, 56, 84 and 86. The drains of n-channel transistors 84 and 86 create a huge resistance such that a small current from p-channel transistors 80, 82 can flip the state at nodes RP, SP. The huge drain resistance of transistors 84, 86 improves the operation of sub-threshold p-channel transistors 80, 82, especially when low power-supply voltages occur early during power-on. The tail resistors also create an I-R voltage drop that raises the ramp voltages SMP, RMP somewhat.

S-R latch 40 can be implemented as a pair of cross-coupled NOR gates 96, 98. Inverters 92, 93 buffer node RP and sub-threshold p-channel transistor 80 from reset input R, while inverters 94, 95 buffer node SP and sub-threshold p-channel transistor 82 from reset input S.

Enable transistors 90, 91 are p-channel transistors that drive both of nodes RP, SP high when enable EN is low. Having both set and reset low prevents toggling of Q and QB from the S-R latch, thus disabling the oscillator. Disabling the oscillator may be useful for power savings modes when it is desirable to stop toggling a clock generated by the oscillator.

The invention uses a single input slope rather than dual input slopes. Dual input slopes use both n-channel and p-channel devices, each with a threshold of about 0.7 volt for both Vtn and Vtp, producing a minimum supply voltage of 1.4 volt. A single slope circuit uses only one type of transistor for the current sources/sinks, and thus can operate at lower power-supply voltages since the power supply needs to rise to only about 1 transistor threshold (Vtp or Vtn, or about 0.7 volt total) rather than 2 transistor thresholds (1.4 volt total). Using sub-threshold sensing further reduces the required power supply voltage so that oscillation begins at about 0.35 volt.

Alternate Embodiments

Several other embodiments are contemplated by the inventors. For example p-channel and n-channel transistors could be swapped, with p-channel transistors being used as current sources and n-channel transistors used for the sub-threshold transistors and charging transistors rather than p-channel transistors.

Additional components may be added at various nodes, such as resistors, capacitors, inductors, transistors, etc., and parasitic components may also be present. Enabling and disabling the oscillator could be accomplished with p-channel transistors as shown in FIG. 8, or with transistors in other locations or of other types. Pass-gate transistors or transmission gates could be added for isolation.

While a S-R latch has been described, other kinds of bistable elements could be substituted, such as J-K flip-flops, toggle flip-flops, D-type flip-flops or latches, etc. Inversions may be added, or extra buffering. The final sizes of transistors and capacitors may be selected after circuit simulation or field testing. Metal-mask options or other programmable components may be used to select the final capacitor size or final transistor sizes.

The duty cycle could be set or selected by the circuit designer. The circuit designer may choose the values of C1, C2 to have a ratio that produces the desired duty cycle. Alternately, the duty cycle could be field-adjustable or field-programmable by having many capacitors of varying size that can be switched into or out of the circuit in response to values in a programmable register. The end user (or more likely the system's firmware or configuration software) could change the value in the programmable register to adjust the duty cycle. The capacitors could be variable capacitors, with the capacitance controlled by a value stored in a programmable register. For example, different sub-capacitors could be muxed together, with the muxes controlled by the programmable register.

While duty cycles of 50%-50% and 33%-66% have been described, many other duty cycles could be designed for.

While Complementary-Metal-Oxide-Semiconductor (CMOS) transistors have been described, other transistor technologies and variations may be substituted, and materials other than silicon may be used, such as Galium-Arsinide (GaAs) and other variations.

While positive currents have been described, currents may be negative or positive, as electrons or holes may be considered the carrier in some cases. Charging and discharging may be interchangeable terms when referring to carriers of opposite polarity. Currents may flow in the reverse direction.

The background of the invention section may contain background information about the problem or environment of the invention rather than describe prior art by others. Thus inclusion of material in the background section is not an admission of prior art by the Applicant.

Any methods or processes described herein are machine-implemented or computer-implemented and are intended to be performed by machine, computer, or other device and are not intended to be performed solely by humans without such machine assistance. Tangible results generated may include reports or other machine-generated displays on display devices such as computer monitors, projection devices, audio-generating devices, and related media devices, and may include hardcopy printouts that are also machine-generated. Computer control of other machines is another tangible result.

Any advantages and benefits described may not apply to all embodiments of the invention. When the word "means" is recited in a claim element, Applicant intends for the claim element to fall under 35 USC Sect. 112, paragraph 6. Often a label of one or more words precedes the word "means". The word or words preceding the word "means" is a label intended to ease referencing of claim elements and is not intended to convey a structural limitation. Such means-plus-function claims are intended to cover not only the structures described herein for performing the function and their structural equivalents, but also equivalent structures. For example, although a nail and a screw have different structures, they are equivalent structures since they both perform the function of fastening. Claims that do not use the word "means" are not intended to fall under 35 USC Sect. 112, paragraph 6. Signals are typically electronic signals, but may be optical signals such as can be carried over a fiber optic line.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

We claim:

1. An ultra-low-voltage oscillator comprising:
   a bistable having a first input and a second input and an output that oscillates;
   a first capacitor having a first capacitance value and a first chargeable plate;
   a second capacitor having a second capacitance value and a second chargeable plate;
   a first charging transistor, coupled to the first capacitor, for charging the first chargeable plate of the first capacitor in response to the output being in a first state;
   a first discharge transistor, coupled to the first capacitor, for continuously discharging the first chargeable plate of the first capacitor;
   a first sub-threshold transistor, having a gate coupled to the first capacitor, for conducting a first sub-threshold current to the first input of the bistable;
   a second charging transistor, coupled to the second capacitor, for charging the second chargeable plate of the second capacitor in response to the output being in a second state;
   a second discharge transistor, coupled to the second capacitor, for continuously discharging the second chargeable plate of the second capacitor; and
   a second sub-threshold transistor, having a gate coupled to the second capacitor, for conducting a second sub-threshold current to the second input of the bistable;
   wherein a ratio of the first capacitance value to the second capacitance value determines a duty cycle of the output of the ultra-low-voltage oscillator.

2. The ultra-low-voltage oscillator of claim 1 wherein the first sub-threshold transistor conducts the first sub-threshold current when the first chargeable plate of the first capacitor has been discharged by the first discharge transistor to generate a gate-to-source voltage across the first sub-threshold transistor of less than a threshold voltage of the first sub-threshold transistor, and more than a sub-threshold voltage of the first sub-threshold transistor,
   wherein the first sub-threshold transistor conducts sub-threshold current below the threshold voltage;
   wherein the second sub-threshold transistor conducts the second sub-threshold current when the second chargeable plate of the second capacitor has been discharged by the second discharge transistor to generate a gate-to-source voltage across the second sub-threshold transistor of less than a threshold voltage of the second sub-threshold transistor, and more than a sub-threshold voltage of the second sub-threshold transistor,
   wherein the second sub-threshold transistor conducts sub-threshold current below the threshold voltage.

3. The ultra-low-voltage oscillator of claim 2 wherein the output begins to oscillate when a power-supply voltage is less than the threshold voltage of the first sub-threshold transistor,
   whereby oscillation starts at a very low power-supply voltage below threshold voltages.

4. The ultra-low-voltage oscillator of claim 1 wherein the output begins to oscillate when a power-supply voltage is less than 0.4 volt.

5. The ultra-low-voltage oscillator of claim 1 wherein the bistable comprises a set-reset S-R latch;
   wherein the first input comprises a set input that sets the output into the first state;
   wherein the second input comprises a reset input that resets the output into the second state.

6. The ultra-low-voltage oscillator of claim 1 further comprising:
   a bias voltage generator for generating a bias voltage;
   wherein the bias voltage is applied to a gate of the first discharge transistor and to a gate of the second discharge transistor.

7. The ultra-low-voltage oscillator of claim 6 further comprising:
   a first complementary transistor coupled to the first input of the bistable, and receiving the bias voltage on a gate, for conducting the first sub-threshold current from the first sub-threshold transistor; and
   a second complementary transistor coupled to the second input of the bistable, and receiving the bias voltage on a gate, for conducting the second sub-threshold current from the second sub-threshold transistor.

8. The ultra-low-voltage oscillator of claim 7 wherein the first and second complementary transistors are n-channel transistors having sources connected to a ground;
wherein the first and second discharge transistors are n-channel transistors having sources connected to the ground.

9. The ultra-low-voltage oscillator of claim 8 wherein the bias voltage generator further comprises:
a bias-generating n-channel transistor having a source connected to the ground, and having a gate and a drain connected together and to the bias voltage; and
a source resistor coupled between a power supply voltage and the bias voltage.

10. The ultra-low-voltage oscillator of claim 9 wherein the first and second complementary transistors and the first and second discharge transistors have sources connected to the ground through source resistors.

11. The ultra-low-voltage oscillator of claim 1 wherein the first and second sub-threshold transistors are p-channel transistors.

12. The ultra-low-voltage oscillator of claim 11 wherein the first and second charging transistors are p-channel transistors.

13. The ultra-low-voltage oscillator of claim 12 wherein the first charging transistor has a gate receiving an inverse of the output of the bistable;
wherein the second charging transistor has a gate receiving the output of the bistable.

14. The ultra-low-voltage oscillator of claim 13 wherein the first capacitor is coupled between a drain of the first charging transistor and a power supply;
wherein the second capacitor is coupled between a drain of the second charging transistor and the power supply.

15. A capacitor-ratio low-voltage oscillator circuit comprising:
a S-R latch having an output, an inverse output, a set input that sets the output, and a reset input that resets the output;
a first sub-threshold transistor having a drain driving a sub-threshold current to the set input, and a gate connected to a first node;
a first capacitor connected to the first node;
a first charging transistor having a drain driving the first node and a source connected to a first supply and a gate receiving the inverse output;
a first discharge transistor that conducts current from the first node to a second supply;
a second sub-threshold transistor having a drain driving a sub-threshold current to the reset input, and a gate connected to a second node;
a second capacitor connected to the second node;
a second charging transistor having a drain driving the second node and a source connected to the first supply and a gate receiving the output; and
a second discharge transistor that conducts current from the second node to the second supply.

16. The capacitor-ratio low-voltage oscillator circuit of claim 15 wherein the first and second charging transistors are p-channel transistors and the first supply is a power supply;
wherein the first and second sub-threshold transistors are p-channel transistors.

17. capacitor-ratio low-voltage oscillator circuit of claim 16 wherein the first and second charging transistors are n-channel transistors having gates driven by a bias voltage;
wherein the second supply is a ground supply.

18. capacitor-ratio low-voltage oscillator circuit of claim 17 wherein the first capacitor is connected between the first node and the first supply;
wherein the second capacitor is connected between the second node and the first supply.

19. An oscillator comprising:
bistable means for toggling an output in response to a first input and in response to a second input;
first capacitor means for storing charge, the first capacitor means having a first capacitance value;
second capacitor means for storing charge, the second capacitor means having a second capacitance value;
first charging transistor means, coupled to the first capacitor means, for charging the first capacitor means in response to the output being in a first state;
first discharge transistor means, coupled to the first capacitor means, for continuously discharging the first capacitor means;
first sub-threshold transistor means, having a gate coupled to the first capacitor means, for conducting a first sub-threshold current to the first input of the bistable means;
second charging transistor means, coupled to the second capacitor means, for charging the second capacitor means in response to the output being in a second state;
second discharge transistor means, coupled to the second capacitor means, for continuously discharging the second capacitor means; and
second sub-threshold transistor means, having a gate coupled to the second capacitor means, for conducting a second sub-threshold current to the second input of the bistable means;
wherein a ratio of the first capacitance value to the second capacitance value is proportional to a duty cycle of the output.

20. The oscillator of claim 19 wherein the output begins to oscillate when a power-supply voltage is less than 0.35 volt, wherein the oscillator is a single-slope circuit.

* * * * *